(12) United States Patent
Hamada

(10) Patent No.: US 7,488,560 B2
(45) Date of Patent: Feb. 10, 2009

(54) LARGE PELLICLE

(75) Inventor: Yuichi Hamada, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 624 days.

(21) Appl. No.: 11/285,304

(22) Filed: Nov. 23, 2005

(65) Prior Publication Data

US 2006/0110664 A1    May 25, 2006

(30) Foreign Application Priority Data

Nov. 24, 2004    (JP)    ............................. 2004-339585

(51) Int. Cl.
*G03F 1/00* (2006.01)
(52) U.S. Cl. .......................................................... 430/5
(58) Field of Classification Search .................. 430/5; 428/14
See application file for complete search history.

(56) References Cited

U.S. PATENT DOCUMENTS

| | | | | |
|---|---|---|---|---|
| 4,861,402 A | | 8/1989 | Gordon | ...................... 156/108 |
| 5,378,514 A | * | 1/1995 | Hamada et al. | ................ 428/14 |
| 5,834,143 A | * | 11/1998 | Matsuoka et al. | .............. 430/5 |
| 7,067,222 B2 | * | 6/2006 | Nagata | .......................... 430/5 |

FOREIGN PATENT DOCUMENTS

| | | |
|---|---|---|
| JP | 63-27707 | 5/1985 |
| JP | 9-54424 | 2/1997 |

* cited by examiner

*Primary Examiner*—Stephen Rosasco
(74) *Attorney, Agent, or Firm*—Kratz, Quintos & Hanson, LLP

(57) ABSTRACT

A pellicle is provided that comprises a pellicle frame that has an upper end face and a lower end face and is a quadrilateral having a side greater than 30 cm or a circle having a diameter of greater than 30 cm, a pellicle film stretched over the upper end face of the pellicle frame, and a pressure-sensitive adhesion layer for affixing an exposure master plate to the pellicle frame, the pressure-sensitive adhesion layer being provided on the lower end face of the pellicle frame, the pressure-sensitive adhesion layer having a thickness of 400 μm or greater, and the pressure-sensitive adhesion layer having a level of cohesive breaking strength such that the pressure-sensitive adhesion layer does not undergo cohesive failure when peeled off from the pellicle frame or the exposure master plate.

12 Claims, 1 Drawing Sheet

LARGE PELLICLE

BACKGROUND OF THE INVENTION

1. Field of the Invention

The present invention relates to a large pellicle frame that is a rectangle with a side of greater than 30 cm or a circle with a diameter of greater than 30 cm, and to a large pellicle for lithography comprising the pellicle frame, the large pellicle being used as a dust shield when producing a liquid crystal display plate, etc.

2. Description of the Related Art

In a production process for a liquid crystal display plate, etc., which has been making remarkable progress in recent years, the size of an exposure master plate has been increasing and at the same time the density of a pattern has been increasing. If foreign bodies (particles) become attached to an exposure master plate when the exposure master plate is exposed to light and patterning is carried out, there are the problems that, since the foreign bodies might absorb light or bend the light, the shape of the foreign bodies might be transferred, the pattern might be deformed, an edge might become rough, a white background might become contaminated with black, the dimensions, the quality, the appearance, etc. might be degraded, and the performance of the liquid crystal display plate, etc. and the productivity might be degraded. The 'exposure master plate' referred to here means, in addition to an exposure master plate for a liquid crystal display, a photomask for semiconductor use, etc., and includes a reticle and a photomask.

Because of this, these operations are usually carried out in a clean room, but even in a clean room it is difficult to always keep the exposure master plate completely clean. Because of this, a method is carried out that employs a large pellicle in which a pellicle film that is good at letting exposure light pass through is stretched over a pellicle frame so that there is a gap of a few mm between itself and the surface of an exposure master plate, and even if foreign bodies become attached during use they are out of focus and no defects occur in a resist film.

In this case, since foreign bodies are not directly attached to the surface of the exposure master plate but are attached on top of the pellicle, by focusing on the pattern of the exposure master plate during lithography, the foreign bodies on the pellicle do not interfere with transfer. With regard to the pellicle film of the large pellicle, a transparent film formed from nitrocellulose, cellulose acetate, an amorphous fluorine-based resin, etc., which are good at letting light pass through, is used, and the film is bonded via an adhesive such as an acrylic resin or an epoxy resin to an upper part of the pellicle frame, which is formed from aluminum, stainless steel, iron, or another metal (U.S. Pat. No. 4,861,402 and JP-B-63-27707 (JP-B denotes a Japanese examined patent application publication)). Double-sided tape formed from an acrylic-based pressure-sensitive adhesive is usually provided on a lower end face of the pellicle frame as a pressure-sensitive adhesive layer in order to mount an exposure master plate, and a separator for the purpose of protecting the pressure-sensitive adhesion layer is further provided.

In general, a step of affixing the large pellicle to the exposure master plate is as follows.

A separator that protects the pressure-sensitive adhesion layer of the large pellicle is peeled off, and the large pellicle is placed at a pellicle attachment position of the exposure master plate. Subsequently, an attachment jig (jig) that can apply pressure to an outer side of an upper part the pellicle frame is set, and a load is applied via the jig. The attachment jig used here is designed so that a weight is applied to an outer peripheral part of an upper face of the pellicle frame so as to prevent a load from being applied to the pellicle film.

Furthermore, even if a large pellicle attachment system (e.g. M515L (product name) manufactured by Matsushita Seiki Co., Ltd., etc.) is used, when a large pellicle is affixed to an exposure master plate, an attachment jig is used. This attachment jig is identical in principle to that described above, and has a structure such that pressure can be applied to an outer peripheral part of an upper face of a pellicle so as to apply a pressure to an upper face of the pellicle frame without making contact with the pellicle film.

The pellicle affixed to the exposure master plate as described above is used in a lithography step, but when its use is completed or the pellicle film is broken, or when it is contaminated with more than a certain quantity or a certain size of foreign bodies, it is necessary to peel off the pellicle from the exposure master plate.

Since the adhesive strength of the large pellicle is set at a high level compared with one for semiconductor use, it is very difficult to peel off. Furthermore, those currently used are affixed to an exposure master plate via a double-sided tape pressure-sensitive adhesive layer, and when peeled off the pressure-sensitive adhesive layer is swollen by means of an organic solvent, etc. or cut off by means of a cutter knife, etc. so as to remove the pellicle from the plate.

When the large pellicle is removed from the exposure master plate by the above-mentioned method, the surface of the exposure master plate is heavily contaminated, and not only is it necessary to expend effort for subsequent cleaning of the exposure master plate, but it might also become impossible to remove the contamination in some cases and an expensive exposure master plate might become unusable.

As in a laid open patent application (JP-A-9-54424 (JP-A denotes a Japanese unexamined patent application publication)), a method has been proposed in which there is a structure where part of a pressure-sensitive adhesive protrudes outside an outer peripheral part of a pellicle frame, and this part is pulled out in a direction away from the frame when peeling off the pellicle. The present inventors have carried out a variety of investigations into the above-mentioned method using the large pellicle, but when a large pellicle having a high bond strength is used, if the above-mentioned method alone is employed, the pressure-sensitive adhesive breaks, a large amount of glue from the pressure-sensitive adhesive remains on the exposure master plate after peeling off, and good results cannot always be obtained.

BRIEF SUMMARY OF THE INVENTION

The present invention solves the above-mentioned problems of the conventional techniques, and it is an object thereof to provide a large pellicle that enables the pellicle to be removed from an exposure master plate without using a solvent, etc. and without being accompanied by cohesive failure in a pressure-sensitive adhesive.

The above-mentioned object has been attained by a pellicle comprising a quadrilateral pellicle frame that has an upper end face and a lower end face and has a side greater than 30 cm, a pellicle film stretched over the upper end face of the pellicle frame, and a pressure-sensitive adhesion layer for affixing an exposure master plate to the pellicle frame, the pressure-sensitive adhesion layer being provided on the lower end face of the pellicle frame, and the pressure-sensitive adhesion layer having a level of cohesive breaking strength such that the pressure-sensitive adhesion layer does not undergo cohesive failure when peeled off from the pellicle frame or the exposure master plate.

In accordance with the present invention, by using a resin having high cohesive strength in a pressure-sensitive adhesion layer provided on a lower end face of a large pellicle and giving a predetermined thickness or greater thereto, the operation of peeling off the pressure-sensitive adhesion layer from an exposure master plate becomes easy; furthermore, it becomes possible to suppress effectively contamination of the exposure master plate and, moreover, it becomes possible to prevent the exposure master plate from becoming unusable.

DETAILED DESCRIPTION OF THE INVENTION

Figure 1:
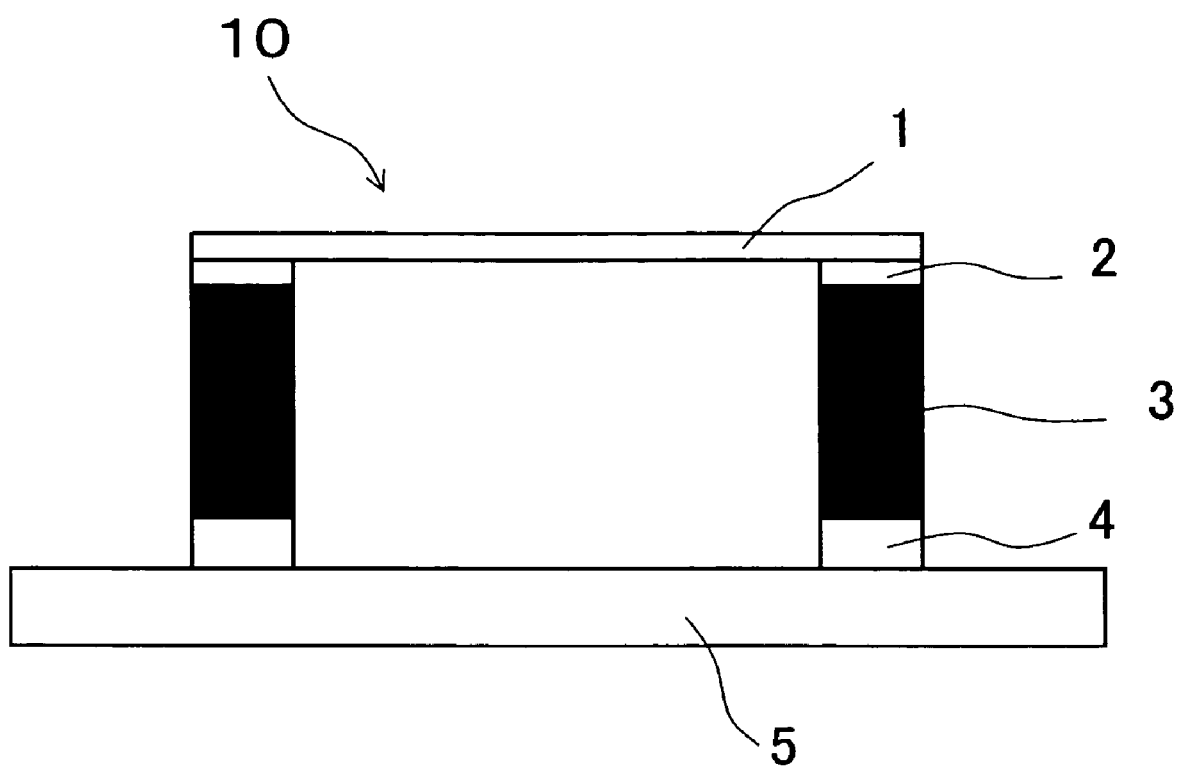
FIG. 1 is a diagram for explaining an example of the arrangement of the pellicle.

The pellicle of the present invention is (1) a pellicle comprising a pellicle frame that has an upper end face and a lower end face and is a quadrilateral having a side greater than 30 cm or a circle having a diameter of greater than 30 cm, a pellicle film stretched over the upper end face of the pellicle frame, and a pressure-sensitive adhesion layer for affixing an exposure master plate to the pellicle frame, the pressure-sensitive adhesion layer being provided on the lower end face of the pellicle frame, the pressure-sensitive adhesion layer having a thickness of 400 µm or greater, and the pressure-sensitive adhesion layer having a level of cohesive breaking strength such that the pressure-sensitive adhesion layer does not undergo cohesive failure when peeled off from the pellicle frame or the exposure master plate.

Preferred embodiments of the pellicle of the present invention according to (1) are listed below.

(2) The pellicle according to (1), wherein the pressure-sensitive adhesion layer has a cohesive breaking strength of 20 g/mm$^2$ or greater when pulled at a speed of 30 mm/min, (3) the pellicle according to (1), wherein the pressure-sensitive adhesion layer essentially consists of a pressure-sensitive adhesive, (4) the pellicle according to (1), wherein the pressure-sensitive adhesion layer is a silicone pressure-sensitive adhesive comprising a rubber component and a silicone resin component.

The structure of the pellicle of the present invention is briefly explained by reference to FIG. 1. This pellicle 10 is preferably formed substantially from a quadrilateral pellicle frame 3 having an upper end face and a lower end face, and a pellicle film 1 stretched over the upper end face of the pellicle frame 3. This pellicle film 1 is usually bonded to the upper end face of the pellicle frame 3 via an adhesive layer 2. A pressure-sensitive adhesion layer 4 for adhering the pellicle 10 to an exposure master plate 5 is provided on the lower end face of the pellicle frame 3.

As a result of repeated attempts by the present inventors with various types of pressure-sensitive adhesion layers in order to discover the requirements for easily peeling off the pressure-sensitive adhesion layer used for the large pellicle, it has been found that it is important for the pressure-sensitive adhesion layer to have a level of cohesive breaking strength that can prevent cohesive failure when the pressure-sensitive adhesion layer is peeled off from the pellicle frame or the exposure master plate, and the present invention has thus been accomplished.

Specifically, it is preferable that the pellicle according to (1) above has a cohesive breaking strength of the pressure-sensitive adhesion layer of 20 g/mm$^2$ or greater when it is pulled at a speed of 30 mm/min.

The cohesive breaking strength is determined from the result of a tensile test in which a pressure-sensitive adhesion layer sample having a rectangular cross-sectional area (S) is formed separately. The test sample is pulled using an Autograph at a speed of 30 mm/min, and a maximum load (W) required before the test sample breaks is recorded. The cohesive breaking strength is given as the result of the calculation W/S. The cohesive breaking strength is calculated using the cross-sectional area prior to pulling as the cross-sectional area.

When the cohesive breaking strength of the pressure-sensitive adhesion layer is 20 g/mm$^2$ or greater, little of the pressure-sensitive adhesive glue residue remains on the surface of the exposure master plate after the pellicle is peeled off, and good results can be obtained. There is no particular upper limit for the cohesive breaking strength; the greater the cohesive breaking strength, the easier the operation of peeling off the pressure-sensitive adhesion layer, but a range of 20 to 200 g/mm$^2$ is practical.

Furthermore, the pellicle according to (1) or (2) above in which the pressure-sensitive adhesion layer essentially consists of a pressure-sensitive adhesive can preferably be used. That is, the pressure-sensitive adhesion layer does not have an inner-substrate including a tape base (PET having a thickness of about 50 µm, etc.) or non-woven fabric that is usually used in a double-sided pressure-sensitive adhesive tape. However, inclusion as necessary of one or more types of additive or filler such as a curing accelerator (a platinum compound, a peroxide, etc.) or a pressure-sensitive adhesion improving agent in the pressure-sensitive adhesion layer used in the present invention is not excluded.

Furthermore, the pellicle according to any one of (1) to (3) above in which the pressure-sensitive adhesion layer has a thickness of 400 µm or greater is preferable. Since the larger the thickness of the pressure-sensitive adhesion layer, the greater the allowance for the peeling operation, there is no particular upper limit, but when taking the cost of the material used into consideration, a pellicle in which the thickness is 400 to 2,000 µm is preferable.

It is suitable to use, for the pressure-sensitive adhesion layer, a pressure-sensitive adhesive such as a polybutene resin, a polyvinyl acetate resin, an acrylic resin, or a silicone resin. With regard to the exposure master plate, those used in lithography, such as a reticle or a photomask may be used.

The pressure-sensitive adhesion layer used in the present invention is preferably formed from a silicone resin. The pressure-sensitive adhesion layer comprising a silicone resin has excellent pressure-sensitive adhesion toward the pellicle frame and the exposure master plate and excellent light stability.

The silicone resin is known and described in, for example, 'Kobunshi Daijiten' (Polymer Dictionary) Ed. by T. Mita, (1994, published by Maruzen), pp. 473 to 482 and publications referred to therein.

The silicone resin is a synthetic polymer represented by $(R_n SiO_{(4-n)/2})_m$, in which n=1 to 3, m≧2, and R is typically a methyl group or a phenyl group. The silicone resin has a straight-chain, branched-chain, or crosslinked structure, and exhibits various chemical and physical properties according to the chemical structure of a repeating unit in the polydimethylsiloxane structure, etc. forming a homopolymer, a random copolymer, or a block copolymer, and the overall structure such as the degree of crosslinking.

The silicone pressure-sensitive adhesive preferably used in the present invention is a reaction product from a polysiloxane (also called an 'MQ resin') comprising a vinyl group-containing polydimethylsiloxane unit $(Me)_3SiO_{0.5}$ (unit M, also called a rubber component) and a silicone resin unit $SiO_2$ (unit Q).

The silicone pressure-sensitive adhesive is a pressure-sensitive adhesive formed by dissolving a polysiloxane comprising a rubber component and a silicone resin component in an organic solvent. The silicone pressure-sensitive adhesive can be used in a wide temperature range of −60° C. to 250° C., and has excellent heat resistance, cold resistance, chemical resistance, electrical insulation, and moisture resistance. The performance depends on the types and the proportions of the rubber component and the resin component of the silicone. The cohesive breaking strength of the silicone pressure-sensitive adhesive can be improved by forming a crosslinked structure by a thermal crosslinking reaction after it is applied to the lower end face of the pellicle frame.

Silicone pressure-sensitive adhesives can be roughly divided into peroxide curing types and addition curing types. The former are general purpose types, and the latter are preferable since higher tack strength can be obtained. The addition curing type silicone pressure-sensitive adhesive does not require pre-drying of a solvent, and is a translucent liquid having a viscosity of 20,000 to 70,000 cP. The cohesive strength of the addition curing type silicone resin can be improved by thermal crosslinking after application and drying. The addition curing type silicone resin has a curing temperature of 90° C. to 150° C., which is lower than a curing temperature of the peroxide curing type silicone resin of 150° C. to 180° C.

The silicone resin is available as a commercial product from Shin-Etsu Chemical Co., Ltd., etc.

The pressure-sensitive adhesion layer used in the pellicle of the present invention can be separated from the exposure master plate by giving a start to the peeling after widening the gap between the pellicle frame and the exposure master plate by 3 to 10 times the thickness of the pressure-sensitive adhesion layer. It is also possible to remove the pressure-sensitive adhesion layer held between the pellicle frame and the reticle by mechanically pulling it outside the pellicle frame after appropriately widening the gap between the pellicle frame and the reticle. During these removal operations, the problem of the pressure-sensitive adhesion layer breaking does not occur.

Examples of the material of the pellicle frame include aluminum, an aluminum alloy, anodized aluminum, and stainless steel.

The pellicle frame is a frame having a circular band-shaped wall or quadrilateral walls, and the cross-sectional shape thereof is preferably a square or a rectangle. The length of the side or the diameter is not particularly limited as long as it is longer than 30 cm; it is typically 40 to 250 cm, and in the case of a rectangle the length of the longer side is preferably 40 to 250 cm.

The height of the pellicle frame is not particularly limited, but it is typically about 1 to 15 mm.

The pellicle frame has an upper end face and a lower end face, and the width thereof is not particularly limited, but it is generally 5 to 20 mm, and preferably 5 to 10 mm.

The pellicle film stretched over the upper end face of the pellicle frame currently employs a transparent resin film such as a cellulose-based film.

As in the case of a pellicle for semiconductor use, the pellicle for LCD use suitably employs a transparent film material that can be used in a wide exposure region from short wavelengths to long wavelengths. Specific examples thereof include fluorine-based polymers such as a copolymer of tetrafluoroethylene and vinylidene fluoride, a ternary copolymer of tetrafluoroethylene, hexafluoropropylene, and vinylidene fluoride, a copolymer of tetrafluoroethylene and a fluorine-containing monomer having a cyclic perfluoroether group, and a polymer of a fluorine-containing monomer having a cyclic perfluoroether group.

Among these, a copolymer of tetrafluoroethylene and a fluorine-containing monomer having a cyclic perfluoroether group (see JP-A-4-104155) and a polymer of a fluorine-containing monomer having a cyclic perfluoroether group (Cytop (product name, manufactured by Asahi Glass Co., Ltd.)), which are amorphous fluorine-containing polymers, are suitably used as a pellicle film since they advantageously have excellent transparency for wavelengths of 210 to 500 nm and are not degraded by light even when used for a long period of time, and the transmittance does not deteriorate.

An adhesive layer used for fixing the pellicle film to the pellicle frame may employ as appropriate any adhesive that has good adhesion to the metal of the pellicle frame and to the pellicle film. Examples of this adhesive include an acrylic resin, an epoxy resin, a fluorine resin, and the above-mentioned silicone resin.

EXAMPLES

The present invention is explained below by reference to examples and comparative examples.

The cohesive breaking strength of the pressure-sensitive adhesive was measured by the measurement method below.

Measurement Method for Cohesive Breaking Strength of Pressure-Sensitive Adhesion Layer A test sample in which the thickness of a pressure-sensitive adhesion layer was 150 μm and the width was 30 mm was prepared, this sample was pulled using an Autograph at a speed of 30 mm/min, and a maximum load required before the test sample broke was recorded.

The value thus obtained was divided by the cross-sectional area of the test sample (0.15 mm×30 mm=4.5 $mm^2$) to give the pressure-sensitive adhesive cohesive breaking strength.

Example 1

An upper face of a pellicle frame made of an aluminum alloy with an anodized surface, which had a height of 5.5 mm, a width of a longer side of 9.0 mm, a width of a shorter side of 7.0 mm, a lengthwise outer periphery of 782.0 mm, and a widthwise outer periphery of 474.0 mm, was coated with, as an adhesive, a 15% toluene solution of silicone pressure-sensitive adhesive KR-3700 (peroxide crosslinked type silicone pressure-sensitive adhesive, manufactured by Shin-Etsu Chemical Co., Ltd.) using a dispenser with a needle having an internal diameter of 0.3 mm to give a dry thickness of 0.2 mm and a smooth surface. A bottom face of the pellicle frame was similarly coated with, as a pressure-sensitive adhesion layer, the silicone pressure-sensitive adhesive KR-3700 to give a width of 4 mm and a dry thickness of 420 μm, and the adhesive and the pressure-sensitive adhesive were then heated at 120° C. for 30 minutes so as to dry and cure them.

The cohesive breaking strength of the pressure-sensitive adhesion layer KR-3700 was measured and was found to be 51 $g/mm^2$.

Subsequently, as the pellicle film a 4.0 μm thick Cytop CTX-S type thin film (manufactured by Asahi Glass Co., Ltd.) was prepared, and fixed via the adhesive previously applied to the upper end face of the pellicle frame. The pellicle thus obtained was placed at a predetermined position on an exposure master plate, and an attachment jig that could apply pressure, across a width of 4 mm, to an outer peripheral part of the upper end face of the pellicle frame was set. The pellicle frame was affixed to the exposure master plate with a weight of 70 kgw (686 N) for 3 minutes through the attachment jig.

24 hours after the affixing, a jig was inserted into an area in the vicinity of a corner of the pellicle frame, and the pellicle frame was pulled upward from the exposure master plate by about 2 mm using the lever principle. Since the pressure-sensitive adhesive adhered strongly to the exposure master plate, even when the pellicle frame was pulled upward from the exposure master plate by about 2 mm using the lever principle as above, the pressure-sensitive adhesion layer only stretched. By giving a start to the peeling by further widening the gap between the pellicle frame and the reticle, the longer side of the pellicle frame was first slowly peeled off from the reticle. After peeling off, the sample was examined by a condenser test, and no contamination was observed other than a few traces of the pressure-sensitive adhesion layer in the original pressure-sensitive adhesion part of the reticle.

Another method for removing the pressure-sensitive adhesion layer was also possible. After the gap between the pellicle frame and the reticle was further widened, the stretched pressure-sensitive adhesive portion was held by tweezers and pulled out toward the outside of the pellicle frame. When it was pulled out by about 5 cm, the pressure-sensitive adhesion layer was cut, and only one end thereof was held by the tweezers and pulled outside along the outer periphery of the pellicle frame. By completing the pulling of the pressure-sensitive adhesive from the pellicle frame outer periphery over about 30 seconds, the pellicle frame could easily be removed from the exposure master plate.

When the exposure master plate was examined after the removal, there were only a few traces of the affixed pressure-sensitive adhesive, and there were no lumps of the pressure-sensitive adhesive, damage, or increased contamination.

Example 2

A pellicle was prepared in the same manner as in Example 1 except that as the pressure-sensitive adhesive a pressure-sensitive adhesive that was a 3/2 mixture of KR3700/KR3701 (manufactured by Shin-Etsu Chemical Co., Ltd.) was used.

24 hours after affixing, peeling off was carried out in the same manner as in Example 1; there were only a few traces of the affixed pressure-sensitive adhesive on the surface of the exposure master plate after peeling, and there were no lumps of the pressure-sensitive adhesive, damage, or increased contamination.

The cohesive breaking strength of the pressure-sensitive adhesive, which was a 3/2 mixture of the pressure-sensitive adhesives KR3700/KR3701, was measured and was found to be 21 g/mm$^2$.

Compared with KR3700, KR3701 contains less vinyl group-containing polydimethylsiloxane unit and has a lower degree of crosslinking. Therefore, in the pressure-sensitive adhesive comprising a mixture of KR3700 and KR3701, if the proportion of KR3701 increases, the cohesive strength of the pressure-sensitive adhesive decreases.

Example 3

A pellicle frame was prepared in the same manner as in Example 1 except that the lengthwise outer periphery of the pellicle frame was 122 cm and the widthwise outer periphery was 140 cm, and it could be used.

Comparative Example 1

A pellicle was prepared in the same manner as in Example 1 except that KR3701 pressure-sensitive adhesive was used as the pressure-sensitive adhesion layer, and it was affixed to an exposure master plate.

24 hours after affixing, when peeling off was carried out in the same manner as in Example 1, the pressure-sensitive adhesion layer tore and stuck to the exposure master plate. In the case of this pressure-sensitive adhesion layer, 20 tears occurred while it was being peeled off once around the pellicle frame, and it stuck to the exposure master plate each time.

When the exposure master plate was examined after peeling, contamination with the pressure-sensitive adhesive was observed in areas where the pressure-sensitive adhesive was torn and stuck. Furthermore, in areas to which the pressure-sensitive adhesive was affixed, there was heavy contamination with the pressure-sensitive adhesive, and the pressure-sensitive adhesion layer had undergone cohesive failure.

The cohesive breaking strength of the pressure-sensitive adhesion layer comprising the pressure-sensitive adhesive KR3701 was measured and was found to be 13 g/mm$^2$.

Comparative Example 2

A pellicle was prepared in the same manner as in Example 1 except that a pressure-sensitive adhesive comprising a 1/1 mixture of KR3700/KR3701 was used as the pressure-sensitive adhesion layer, and it was affixed to an exposure master plate.

24 hours after affixing, when peeling off was carried out in the same manner as in Example 1, the pressure-sensitive adhesion layer tore and stuck to the exposure master plate. In the case of this pressure-sensitive adhesive, 5 tears occurred while it was being peeled off once around the pellicle frame, and it stuck to the exposure master plate each time.

When the exposure master plate was examined after peeling, contamination with the pressure-sensitive adhesive was observed in areas where the pressure-sensitive adhesive was torn and stuck. Furthermore, the traces of residue contamination in areas to which the pressure-sensitive adhesive was affixed were clearly heavier compared with the pressure-sensitive adhesives of the Examples, and the pressure-sensitive adhesion layer appeared to have undergone cohesive failure.

The cohesive breaking strength of the pressure-sensitive adhesion layer comprising a 1/1 mixture of the pressure-sensitive adhesives KR3700/KR3701 was measured and was found to be 18 g/mm$^2$.

Comparative Example 3

A pellicle was prepared in the same manner as in Example 1 except that the thickness of the pressure-sensitive adhesive was changed to 350 μm, and it was affixed to an exposure master plate.

24 hours after affixing, when peeling off was carried out in the same manner as in Example 1, the pressure-sensitive adhesion layer tore and stuck to the exposure master plate. In the case of this pressure-sensitive adhesive, tears occurred twice while it was being peeled off once around the pellicle frame, and it stuck to the exposure master plate each time. When the exposure master plate was examined after peeling, contamination with the pressure-sensitive adhesive was observed in areas where the pressure-sensitive adhesive was torn and stuck. However, on the surface of the exposure master plate in other areas, there was little trace of the affixed pressure-sensitive adhesive, and there were no lumps of the pressure-sensitive adhesive, damage, or increased contamination.

The above results are shown together in Table 1.

TABLE 1

| | Type of pressure-sensitive adhesive | Thickness of pressure-sensitive adhesive (μm) | Cohesive breaking strength (g/mm$^2$) | Peeled condition |
| --- | --- | --- | --- | --- |
| Example 1 | KR3700 | 420 | 51 | Good |
| Example 2 | KR3700/ KR3701 = 3/2 | 420 | 21 | Good |
| Comp. Ex. 1 | KR3701 | 420 | 13 | Large amount of glue remained in affixed area; tore 20 times |
| Comp. Ex. 2 | KR3700/ KR3701 = 1/1 | 420 | 18 | Large amount of glue remained in affixed area; tore 5 times |
| Comp. Ex. 3 | KR3700 | 350 | 51 | Small amount of glue remained in affixed area; tore twice |

The present invention should not be construed as being limited by the above-mentioned embodiments. The above-mentioned embodiments are only illustrative, and any modifications having substantially the same arrangement as the technical spirit described in Claims of the present invention and exhibiting the same operational effects are included in the technical scope of the present invention.

What is claimed is:

1. A pellicle comprising:
   a pellicle frame that has an upper end face and a lower end face and is a quadrilateral having a side greater than 30 cm or a circle having a diameter of greater than 30 cm;
   a pellicle film stretched over the upper end face of the pellicle frame; and
   a pressure-sensitive adhesion layer for affixing an exposure master plate to the pellicle frame, the pressure-sensitive adhesion layer being provided on the lower end face of the pellicle frame;
   the pressure-sensitive adhesion layer having a thickness of 400 μm or greater; and
   the pressure-sensitive adhesion layer having a level of cohesive breaking strength such that the pressure-sensitive adhesion layer does not undergo cohesive failure when peeled off from the pellicle frame or the exposure master plate.

2. The pellicle according to claim 1, wherein the pressure-sensitive adhesion layer has a cohesive breaking strength of 20 g/mm$^2$ or greater when pulled at a speed of 30 mm/min.

3. The pellicle according to claim 1, wherein the pressure-sensitive adhesion layer essentially consists of a pressure-sensitive adhesive.

4. The pellicle according to claim 1, wherein the pellicle frame has a side or a diameter of 40 to 250 cm.

5. The pellicle according to claim 1, wherein the pressure-sensitive adhesion layer has a thickness of 400 to 2,000 μm.

6. The pellicle according to claim 5, wherein the pressure-sensitive adhesion layer has a thickness of 400 to 800 μm.

7. The pellicle according to claim 3, wherein the pressure-sensitive adhesion layer comprises a pressure-sensitive adhesive comprising a resin selected from the group consisting of a polybutene resin, a polyvinyl acetate resin, an acrylic resin, and a silicone resin.

8. The pellicle according to claim 7, wherein the pressure-sensitive adhesion layer is a silicone pressure-sensitive adhesive comprising a rubber component and a silicone resin component.

9. The pellicle according to claim 8, wherein the silicone pressure-sensitive adhesive has an improved cohesive breaking strength as a result of forming a crosslinked structure.

10. The pellicle according to claim 1, wherein the pellicle frame has a height of 1 to 15 mm.

11. The pellicle according to claim 1, wherein the pellicle film is selected from the group consisting of fluorine-based polymers such as a copolymer of tetrafluoroethylene and vinylidene fluoride, a ternary copolymer of tetrafluoroethylene, hexafluoropropylene, and vinylidene fluoride, a copolymer of tetrafluoroethylene and a fluorine-containing monomer having a cyclic perfluoroether group, and a polymer of a fluorine-containing monomer having a cyclic perfluoroether group.

12. The pellicle according to claim 11, wherein the pellicle film is a copolymer of tetrafluoroethylene and a fluorine-containing monomer having a cyclic perfluoroether group, or a polymer of a fluorine-containing monomer having a cyclic perfluoroether group (Cytop (product name, manufactured by Asahi Glass Co., Ltd.)), which are amorphous fluorine-containing polymers.

* * * * *